(12) United States Patent
Toyoda et al.

(10) Patent No.: US 8,922,031 B2
(45) Date of Patent: Dec. 30, 2014

(54) THERMOSETTING ENCAPSULATION ADHESIVE SHEET

(75) Inventors: Eiji Toyoda, Ibaraki (JP); Hiroshi Noro, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 18 days.

(21) Appl. No.: 13/405,706

(22) Filed: Feb. 27, 2012

(65) Prior Publication Data

US 2012/0153513 A1 Jun. 21, 2012

Related U.S. Application Data

(62) Division of application No. 12/119,896, filed on May 13, 2008, now abandoned.

(30) Foreign Application Priority Data

May 17, 2007 (JP) .................... 2007-131994

(51) Int. Cl.
*B32B 7/12* (2006.01)
*C09J 163/00* (2006.01)
*C08L 33/00* (2006.01)

(52) U.S. Cl.
CPC ............... *C09J 163/00* (2013.01); *C08L 33/00* (2013.01)
USPC ............... 257/795; 428/355 EP; 428/355 R; 257/787; 257/788; 257/777; 257/778; 257/789; 257/793; 257/E23.119; 438/112; 438/124; 438/126; 438/127; 524/154; 524/493; 524/502; 523/467

(58) Field of Classification Search
CPC ............... H03H 9/1078; C09J 163/10; H01L 2924/181; H01L 2924/1811
See application file for complete search history.

(56) References Cited

U.S. PATENT DOCUMENTS

| | | | | |
|---|---|---|---|---|
| 3,859,379 | A * | 1/1975 | Kitamura et al. | 525/486 |
| 5,641,840 | A * | 6/1997 | Tsuchida et al. | 525/481 |
| 5,683,806 | A | 11/1997 | Sakumoto et al. | |
| 5,905,301 | A * | 5/1999 | Ichikawa et al. | 257/676 |
| 5,994,785 | A * | 11/1999 | Higuchi et al. | 257/789 |
| 6,181,015 | B1 * | 1/2001 | Gotoh et al. | 257/778 |
| 6,200,830 | B1 | 3/2001 | Ito et al. | |
| 6,210,811 | B1 * | 4/2001 | Honda et al. | 428/620 |
| 6,310,421 | B2 * | 10/2001 | Morishima | 310/313 R |
| 6,495,260 | B1 * | 12/2002 | Takasaki et al. | 428/413 |
| 7,034,434 | B2 | 4/2006 | Yamamoto et al. | |
| 7,501,711 | B2 | 3/2009 | Eto et al. | |
| 7,524,394 | B2 | 4/2009 | Nakanishi et al. | |
| 7,741,388 | B2 * | 6/2010 | Murotani et al. | 523/400 |
| 2001/0004651 | A1 * | 6/2001 | Tomiyoshi et al. | 524/493 |
| 2002/0151106 | A1 | 10/2002 | Noro et al. | |
| 2004/0158008 | A1 | 8/2004 | He et al. | |
| 2004/0251777 | A1 | 12/2004 | Yamamoto et al. | |
| 2005/0154152 | A1 | 7/2005 | Toyoda et al. | |
| 2006/0163750 | A1 * | 7/2006 | Kaneko | 257/778 |
| 2006/0234043 | A1 | 10/2006 | Nakanishi et al. | |
| 2008/0286562 | A1 * | 11/2008 | Toyoda et al. | 428/327 |

FOREIGN PATENT DOCUMENTS

| | | | | |
|---|---|---|---|---|
| CN | 1865382 B | 5/2011 | | |
| EP | 1447421 A1 | 8/2004 | | |
| JP | 2000-273289 A | 10/2000 | | |
| JP | 2002-201288 A | 7/2002 | | |
| JP | 2004-7051 A | 1/2004 | | |
| JP | 2004007051 A * | 1/2004 | ............... | H03H 9/25 |
| JP | 2004-56296 A | 2/2004 | | |
| JP | 2004-64732 A | 2/2004 | | |
| JP | 2005-39331 A | 2/2005 | | |
| JP | 2007-329162 A | 12/2007 | | |

OTHER PUBLICATIONS

James. D.B.Smith, "Quaternary phosphonium compound latent accelerators for anhydride-cured epoxy resins", Ameican Chemical Society Symposium Series, Washington DC 1979, pp. 47-56.*
Kiuchi, Takumi et al., "Sealing member, and method for producing surface acoustic wave apparatus by using the same", machine translation of JP 2004-007051A, published on Jan. 8, 2004.*
Takumi, Kikuchi et al., "Sealing Member and Surface Acoustic Wave Device Manufacturing Method Using Same", English translation of JP2004-007051A, published on Jan. 8, 2004, pp. 1-20.*
Chinese Office Action dated Oct. 9, 2012, issued in corresponding Chinese Patent Application No. 200810099237.4 , with English translation (8 pages).
European Search Report dated Sep. 26, 2008, issued in corresponding European Patent Appllication No. 08008531.9.
Chinese Office Action dated Apr. 1, 2013, issued in corresponding Chinese Patent Application No. 200810099237.4 , with English translation (8 pages).
Japanese Office Action mailed Jul. 24, 2012, issued in corresponding Japanese Patent Application No. 2007-131994, w/ English translation.
Chinese Office Action dated Aug. 5, 2013, issued in corresponding Chinese Patent Application No. 200810099237.4 with English translation (9 pages).
Chinese Office Action dated Dec. 21, 2011, issued in corresponding Chinese Patent Application No. 200810099237.4.

(Continued)

*Primary Examiner* — Hai Vo
*Assistant Examiner* — Anish Desai
(74) *Attorney, Agent, or Firm* — Westerman, Hattori, Daniels & Adrian, LLP

(57) ABSTRACT

A thermosetting encapsulation adhesive sheet which is used for encapsulating a chip type device (1) having connection electrodes (bumps) (3) and mounted on a wiring circuit board (2). The thermosetting encapsulation adhesive sheet is composed of an epoxy resin composition having a viscosity of $5 \times 10^4$ to $5 \times 10^6$ Pa·s as measured at a temperature of 80 to 120° C. before thermosetting thereof. The thermosetting encapsulation adhesive sheet makes it possible to conveniently encapsulate a hollow device with an improved yield.

2 Claims, 1 Drawing Sheet

(56) References Cited

OTHER PUBLICATIONS

Taiwanese Office Action dated May 30, 2013, issued in corresponding Taiwanese Patent Application No. 097117649, w/ English translation.

Chinese Notification of Reexamination dated Aug. 28, 2014, issued for the Chinese Application No. 200810099237.4; W/English Translation. (17 pages).

* cited by examiner

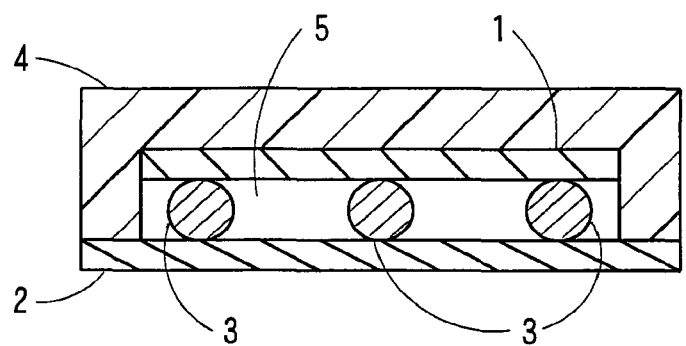

THERMOSETTING ENCAPSULATION ADHESIVE SHEET

CROSS-REFERENCE TO RELATED APPLICATION

This application is a divisional application of U.S. Ser. No. 12/119,896, filed May 13, 2008, which is based upon and claims the benefit of priority of the prior Japanese Patent Application No. 2007-131994, filed May 17, 2007, the entire contents of which are incorporated herein by reference.

BACKGROUND OF THE INVENTION

1. Field of the Invention

The present invention relates to a thermosetting adhesive sheet to be employed for encapsulating a chip type device and, more specifically, to a thermosetting adhesive sheet to be employed for encapsulating a so-called hollow device, such as a surface acoustic wave device (SAW device), a quartz device, a high frequency device or an acceleration sensor, which is required to have a hollow surface.

2. Description of the Related Art

Conventionally, encapsulation of a chip type device such as a semiconductor element or an electronic component is achieved by a transfer molding method employing a powdery epoxy resin composition, or a potting method, a dispensing method or a printing method employing a liquid epoxy resin composition, a silicone resin or the like. These encapsulation methods require an expensive molding machine, and suffer from a problem such that the encapsulation resin adheres to unwanted portions of the device. Therefore, a less expensive and more convenient encapsulation method is demanded.

Particularly, where the conventional dispensing method employing a liquid encapsulation material is employed for the encapsulation of a device required to have a hollow surface, it is difficult to suppress intrusion of the encapsulation material into an active surface below the device. The intrusion of the encapsulation material is controlled by providing a dam on the chip or a substrate (see, for example, JP-A-2004-64732, JP-A-2004-56296 and JP-A-2005-39331). Even with this method, complete rheological control of the liquid encapsulation material is difficult. This may reduce the yield, and prevent the size reduction and the cost reduction of the device.

Thus, the conventional control of the resin encapsulation of the hollow device is not satisfactory.

In view of the foregoing, it is an object of the present invention to provide a thermosetting encapsulation adhesive sheet, which makes it possible to conveniently encapsulate a hollow device with an improved yield.

DISCLOSURE OF THE INVENTION

To achieve the aforementioned object, an inventive thermosetting encapsulation adhesive sheet to be used for encapsulating a chip type device mounted on a substrate comprises an epoxy resin composition having a viscosity of $5\times10^4$ to $5\times10^6$ Pa·s as measured at a temperature of 80° C. to 120° C. before thermosetting thereof.

To achieve the aforementioned object, the inventors of the present invention conducted studies on the physical properties of a thermosetting adhesive sheet to be employed as an encapsulation material. The inventors further conducted intensive studies on the viscosity of the sheet at an encapsulation temperature before the thermosetting. As a result, the inventors found that, if a sheet having a viscosity in the aforementioned specific viscosity range at a temperature of 80° C. to 120° C. before the thermosetting is employed as the thermosetting adhesive sheet, the intrusion of the resin into below the chip type device is suppressed when the chip type device on the substrate is encapsulated with the thermosetting adhesive sheet having such a proper viscosity, and thus the present invention is attained.

As described above, the inventive thermosetting encapsulation adhesive sheet to be used for encapsulating the chip type device mounted on the substrate comprises the epoxy resin composition having a viscosity of $5\times10^4$ to $5\times10^6$ Pa·s as measured at a temperature of 80° C. to 120° C. before the thermosetting thereof. Therefore, the intrusion of the resin into below the chip type device is suppressed during the encapsulation of the chip type device mounted on the substrate, so that a hollow space can be kept defined between the substrate and the chip type device. Thus, the resin encapsulation can be conveniently achieved with an improved yield with the use of a thermosetting encapsulation adhesive sheet.

The epoxy resin composition preferably comprises the following components (A) to (E): (A) an epoxy resin; (B) a phenol resin; (C) an elastomer; (D) an inorganic filler; and (E) a curing accelerating agent. In this case, the thermosetting encapsulation adhesive sheet can be easily provided which has a viscosity controlled at a predetermined level under the aforementioned conditions.

Where the inorganic filler (D) is present in the epoxy resin composition in a proportion of 60 to 80% by weight based on the weight of the epoxy resin composition, the thermosetting encapsulation adhesive sheet can be more easily provided which has a viscosity controlled at a predetermined level under the aforementioned conditions.

Where the curing accelerating agent (E) is a quaternary phosphonium salt compound, the thermosetting encapsulation adhesive sheet can be easily provided which has a viscosity controlled at a predetermined level under the aforementioned conditions and is excellent in storage stability at ordinary temperatures.

BRIEF DESCRIPTION OF THE DRAWING

The sole figure of the drawing is a sectional view schematically illustrating an exemplary semiconductor device encapsulated with an inventive thermosetting encapsulation adhesive sheet.

DETAILED DESCRIPTION OF PREFERRED EMBODIMENTS

Embodiments of the present invention will hereinafter be described in detail.

A thermosetting encapsulation adhesive sheet according to the present invention is composed of an epoxy resin composition having a specific viscosity at a temperature in a specific temperature range before thermosetting thereof. To provide the thermosetting encapsulation adhesive sheet, an epoxy resin composition containing an epoxy resin (Component (A)), a phenol resin (Component (B)), an elastomer (Component (C)), an inorganic filler (Component (D)) and a curing accelerating agent (Component (E)) is formed in a sheet.

The epoxy resin (A) is not particularly limited, but examples thereof include dicyclopentadiene epoxy resins, cresol novolak epoxy resins, phenol novolak epoxy resins, bisphenol-A epoxy resins, bisphenol-F epoxy resins, biphenyl epoxy resins, trishydroxyphenylmethane epoxy resins and naphthalenediol epoxy resins. These epoxy resins may be used either alone or in combination. In consideration of the softness of the resin composition at a B-stage and the mechanical strength of the resin composition in a cured state, it is particularly preferred to use a naphthalenediol epoxy resin and a bisphenol-A epoxy resin in combination or to use a bisphenol-A epoxy resin and a trishydroxyphenylmethane epoxy resin in combination.

The phenol resin (B) is not particularly limited, as long as it is reactive with the epoxy resin (A) for curing. Examples of the phenol resin (B) include dicyclopentadiene phenol resins, phenol novolak resins, cresol novolak resins and phenol aralkyl resins. These phenol resins may be used either alone or in combination. The phenol resin (B) preferably has a hydroxy equivalent of 70 to 250 and a softening point of 50° C. to 110° C. It is particularly preferred to use a phenol novolak resin which is highly reactive for curing.

A blending ratio between the epoxy resin (A) and the phenol resin (B) is preferably such that hydroxyl groups in the phenol resin (B) are present in a total proportion of 0.7 to 1.5 equivalents, more preferably 0.9 to 1.2 equivalents, per epoxy equivalent of the epoxy resin (A).

The elastomer (C) to be employed together with Components (A) and (B) imparts the epoxy resin composition with softness and flexibility. As long as the elastomer has such a function, the structure of the elastomer is not particularly limited. For example, a rubbery polymer may be employed as the elastomer (C). Examples of the rubbery polymer include acrylate copolymers such as polyacrylates, and butadiene rubbers, styrene-butadiene rubbers (SBR), ethylene-vinyl acetate copolymers (EVA), isoprene rubbers and acrylonitrile rubbers, which may be used either alone or in combination.

In order to impart the resin composition with softness and flexibility, the elastomer (C) is preferably present in the epoxy resin composition in a proportion of 15 to 70% by weight, more preferably 30 to 60% by weight, based on the total weight of the organic components of the epoxy resin composition. If the proportion of the elastomer (C) is less than the lower limit, it is difficult to impart the resin composition with softness and flexibility as desired, making the handling of the adhesive sheet more difficult. On the other hand, if the proportion is greater than the upper limit, a product formed (or cured) after resin encapsulation tends to have insufficient strength.

The inorganic filler (D) to be employed together with Components (A) to (C) is not particularly limited, but any of various conventionally known inorganic fillers may be used. Examples of the inorganic fillers include quartz glass powder, talc, silica powder (fused silica powder, crystalline silica powder and the like), alumina powder, aluminum nitride powder and silicon nitride powder, which may be used either alone or in combination. It is preferred to use the silica powder, which can reduce the linear expansion coefficient of the resulting cured product. Among the aforementioned silica powders, the fused silica powder is particularly preferred because of its higher packing density and higher fluidity. The fused silica powder includes spherical fused silica powder and pulverized fused silica powder. In terms of fluidity, the spherical fused silica powder is preferred. Particularly, spherical fused silica powder having an average particle diameter of 0.2 to 30 μm is preferred, and spherical fused silica powder having an average particle diameter of 0.5 to 15 μm is more preferred. It is noted that the average particle diameter is determined, for example, by analyzing a particle size distribution of a specimen arbitrarily sampled from a population by means of a laser diffraction/scattering particle size distribution measuring device.

The inorganic filler (D) is preferably present in the epoxy resin composition in a proportion of 60 to 80% by weight, particularly preferably 65 to 75% by weight, based on the weight of the epoxy resin composition. If the proportion of the inorganic filler (D) is less than the lower limit, the resulting resin composition tends to have a reduced viscosity at a temperature in the specific temperature range before the thermosetting, failing to have desired physical properties. If the proportion is greater than the upper limit, the resulting resin composition tends to have an excessively high viscosity at a temperature in the specific temperature range before the thermosetting, and fails to have desired physical properties.

The curing accelerating agent (E) to be employed together with Components (A) to (D) is not particularly limited, as long as it can accelerate the curing reaction between the epoxy resin (A) and the phenol resin (B). Any of conventionally known curing accelerating agents may be used. Examples of the existing curing accelerating agents include phosphorus curing accelerating agents and amine curing accelerating agents. It is particularly preferred to use a quaternary phosphonium salt compound to impart the thermosetting adhesive sheet with excellent storage stability at ordinary temperatures. In consideration of handling ease and quality stability of the inventive thermosetting encapsulation adhesive sheet in practical application, it is preferred that the thermosetting encapsulation adhesive sheet can be stored at ordinary temperatures for a long period of time. In order to impart the thermosetting encapsulation adhesive sheet with such a property, it is particularly preferred to use, for example, tetraphenylphosphonium tetraphenylborate as the curing accelerating agent (E).

The curing accelerating agent (E) is preferably present in the epoxy resin composition in a proportion of 0.1 to 10% by weight, more preferably 0.3 to 3% by weight, particularly preferably 0.5 to 2% by weight, based on the weight of the epoxy resin composition.

In the present invention, a flame retarder, a pigment such as carbon black and other additives may be added as required to the epoxy resin composition containing Components (A) to (E).

Examples of the flame retarder include organic phosphorus compounds, antimony oxide, and metal hydroxides such as aluminum hydroxide and magnesium hydroxide, which may be used either alone or in combination.

The inventive thermosetting encapsulation adhesive sheet can be produced, for example, in the following manner. First, the epoxy resin composition is prepared by mixing the components. The mixing method is not particularly limited, as long as the components can be evenly dispersed to be mixed. Then, the components are dissolved in a solvent or the like as required, and the resulting varnish is formed into a film by coating. Alternatively, the formation of the film may be achieved by directly kneading the components by a kneader or the like to prepare a solid resin, and extruding the solid resin into a sheet. Particularly, the varnish coating method is preferably employed, because the sheet can be easily produced as having a uniform thickness.

The production of the inventive thermosetting encapsulation adhesive sheet employing the varnish coating method will be described in detail. The varnish is prepared by properly mixing Components (A) to (E) and the optional additives in a conventional manner and then evenly dissolving or dispersing the resulting mixture in an organic solvent. Then, the varnish is applied on a substrate such as a polyester film and dried, thereby providing the thermosetting adhesive sheet. Further, a film such as a polyester film is applied on the thermosetting adhesive sheet, which is wound up in a state such that the sheet is held between the polyester films.

The organic solvent is not particularly limited, but examples thereof include conventionally known organic solvents such as methyl ethyl ketone, acetone, dioxane, diethyl ketone, toluene and ethyl acetate, which may be used either alone or in combination. The total concentration of Components (A) to (E) and the optional additives in the organic solvent is preferably 30 to 60% by weight.

The thickness of the thermosetting encapsulation adhesive sheet after the drying of the organic solvent is not particularly limited, but is typically 5 to 100 μm, more preferably 20 to 70 μm, in consideration of the evenness of the thickness and a residual solvent amount. The inventive thermosetting encapsulation adhesive sheet may be a laminate sheet prepared by stacking a plurality of such sheets to a desired thickness. That is, the inventive thermosetting encapsulation adhesive sheet may be a single layer structure or a multi-layer structure including two or more such sheets stacked into a laminate. The inventive thermosetting encapsulation adhesive sheet thus produced should have a viscosity of $5 \times 10^4$ to $5 \times 10^6$ Pa·s as measured at a temperature of 80 to 120° C. before thermosetting thereof.

If the viscosity at a temperature in the aforementioned temperature range is less than $5 \times 10^4$ Pa·s, the encapsulation resin is liable to intrude into a hollow portion below a chip type device. If the viscosity is greater than $5 \times 10^6$ Pa·s, adhesion between a resin encapsulation portion and a substrate is poorer.

The viscosity at a temperature of 80 to 120° C. before the thermosetting is measured in the following manner. The thermosetting encapsulation adhesive sheet yet to be subjected to the thermosetting is prepared as a measurement object, and the viscosity of the adhesive sheet is measured at a temperature of 80 to 120° C. by means of a viscoelasticity measuring device.

The chip type device mounted on the substrate is encapsulated with the inventive thermosetting encapsulation adhesive sheet, for example, in the following manner. After the chip type device is mounted in a predetermined position on the substrate, the thermosetting encapsulation adhesive sheet is placed as covering the mounted chip type device. Then, the sheet is thermally set under predetermined encapsulation conditions, whereby the chip type device is resin-encapsulated with a hollow space kept defined between the chip type device and the substrate.

The encapsulation is achieved by performing a vacuum pressing process at a temperature of 80° C. to 100° C. at a pressure of 100 to 500 kPa for 0.5 to 5 minutes, then opening the system to an atmospheric pressure, and performing a heating process at a temperature of 150° C. to 190° C. for 30 to 120 minutes.

An exemplary construction of the semiconductor device thus provided will be described. As shown in the figure, a chip type device 1 is mounted on a wiring circuit board 2 with connection electrodes (bumps) 3 thereof being opposed to connection electrodes (not shown) of the wiring circuit board 2. An encapsulation resin layer 4 is provided on the wiring circuit board 2 as covering the chip type device 1 mounted on the wiring circuit board 2 for resin encapsulation. A hollow portion 5 is defined between the chip type device 1 and the wiring circuit board 2 below the chip type device 1.

In the aforementioned semiconductor device, the connection electrodes 3 of the chip type device 1 each have a bump shape, but the shape of the connection electrodes 3 is not limited to the bump shape. The connection electrodes of the wiring circuit board 2 may also each have a bump shape.

A gap distance between the chip type device 1 and the wiring circuit board 2 (the height of the hollow portion 5) is properly determined depending on the dimensions of the connection electrodes (bumps) 3, but is typically about 10 to about 100 μm. In general, a distance between the connection electrodes (bumps) 3 is preferably about 150 to about 500 μm.

EXAMPLES

Inventive examples will hereinafter be described in conjunction with comparative examples. However, it should be understood that the present invention be not limited to these inventive examples.

First, the following ingredients were prepared.
Epoxy resin-a: A naphthalenediol epoxy resin (ESN-355 available from Tohto Kasei Co., Ltd.)
Epoxy resin-b: A bisphenol-A epoxy resin (EPICOAT 828 available from Japan Epoxy Resin Co., Ltd.)
Epoxy resin-c: A trishydroxyphenylmethane epoxy resin (EPPN-501HY available from Nippon Kayaku Co., Ltd.)
Phenol resin-a: A novolak phenol resin (H-4 available from Meiwa Plastic Industries, Ltd.)
Phenol resin-b: A novolak phenol resin (DL-65 available from Meiwa Plastic Industries, Ltd.)
Acryl resin-a: An acryl copolymer (TEISAN RESIN SG-70L available from Nagase ChemteX Corporation)
Acryl resin-b: An acryl copolymer (TEISAN RESIN SG-P3 available from Nagase ChemteX Corporation)
Curing accelerating agent-a: Tetraphenylphosphonium tetraphenylborate (TPP-K available from Hokko Chemical Industry Co., Ltd.)
Curing accelerating agent-b: Triphenylphophine (TPP available from Hokko Chemical Industry Co., Ltd.)
Silica powder: Spherical fused silica powder having an average particle diameter of 5.5 μm (FB-7SDC available from Denkikagaku Kogyo K.K.)

Examples 1 to 4 and Comparative Examples 1 and 2

Sheet coating varnishes were each prepared by dispersing and mixing the ingredients in proportions as shown in Table 1 and adding 100 pars by weight of an organic solvent (methyl ethyl ketone).

Then, the resulting varnishes were each applied onto a 50-μm thick polyester film (MRF-50 available from Mitsubishi Polyester Film Corporation) by a comma coater, and dried. Further, a 38-μm thick polyester film (MRX-38 available from Mitsubishi Polyester Film Corporation) was applied onto the resulting coating. Thus, a thermosetting adhesive sheet was provided in a state such that the sheet is held between the polyester films. Thereafter, a plurality of such adhesive sheets were laminated by a roll laminator. Thus, a 400-μm thick thermosetting adhesive sheet was produced.

Viscosity

The viscosities of the thermosetting adhesive sheet thus produced (as measured at 80° C. and 120° C. before thermosetting) were determined by a viscoelasticity measuring device ARES available from Rheometrix Corporation at a shear rate of 28.0 (1/s) at a temperature increasing rate of 5° C./min.

Evaluation of Encapsulation

The thermosetting adhesive sheet thus produced was placed on SAW filter chips (each having a chip thickness of 200 μm and a bump height of 30 μm) arranged in a matrix array on a ceramic substrate as covering the SAW filter chips, and then vacuum-pressed (to a target vacuum degree of $6.65 \times 10^2$ Pa) at a temperature of 100° C. at a pressure of 300 kPa for one minute. After the system was opened to an atmospheric pressure, the resulting substrate is allowed to stand in an oven at 175° C. for one hour to thermally set the thermosetting adhesive sheet. Thereafter, the resulting substrate was diced into chip packages by a dicing device. A section of each of the resulting chips was observed to be checked for intrusion of the resin into a hollow portion below the chip and for adhesion between the substrate and an encapsulation resin portion formed by the thermosetting adhesive sheet. A chip suffering from intrusion of the resin into the hollow portion below the chip was rated as unacceptable (×), and a chip free from the intrusion was rated as acceptable (○). For evaluation of the adhesion, a chip having sufficient adhesion was rated as acceptable (○), and a chip having insufficient adhesion with a gap between the resin portion and the ceramic substrate on a side surface of the chip after the dicing was rated as unacceptable (×).

Reflow Resistance Test

The chip was subjected to a solder reflow process at 260° C. for ten seconds three times, and checked for delamination of the thermosetting adhesive sheet (encapsulation resin portion) from the substrate. As a result, a chip free from the delamination was rated as acceptable (○), and a chip suffering from the delamination was rated as unacceptable (×).

Storage Stability at Ordinary Temperatures

After the thermosetting adhesive sheet was stored at 20° C. for six months, the viscosity of the sheet at 80° C. before the thermosetting was measured in the aforesaid manner by the Rheometrix's viscoelasticity measuring device ARES. As a result, a sheet having a viscosity increased by less than 20% from the viscosity previously measured at 80° C. before the thermosetting was rated as acceptable (○), and a sheet having a viscosity increased by not less than 20% or unmeasurable due to curing was rated as unacceptable (×). The measured viscosity is also shown in Table 1.

The results of the measurement and the evaluation are shown in the following Table 1.

range was free from the intrusion of the resin into below the chip and excellent in adhesion to the substrate, but the measurement of the viscosity after the storage at 20° C. for the evaluation of the ordinary temperature storage stability was impossible due to curing. However, little change in viscosity was observed during low temperature storage at 5° C. or lower, so that Example 4 has practically acceptable storage stability.

On the other hand, the thermosetting adhesive sheets of Comparative Examples 1 and 2 each having viscosities falling outside the specific viscosity range at the temperatures in the specific temperature range, particularly, the thermosetting adhesive sheet of Comparative Example 1 having viscosities lower than the specific viscosity range, suffered from the intrusion of the resin into below the chip, and was poorer in reflow resistance. Further, the thermosetting adhesive sheet of Comparative Example 2 having viscosities higher than the specific viscosity range was insufficient in adhesion to the substrate.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. A thermosetting encapsulation adhesive sheet for encapsulating a chip device mounted on a substrate through a connection electrode formed on the chip device, the thermosetting encapsulation adhesive sheet encapsulating the chip device such that the thermosetting encapsulation adhesive

TABLE 1

| | | Example | | | | Comparative Example | |
|---|---|---|---|---|---|---|---|
| | | 1 | 2 | 3 | 4 | 1 | 2 |
| Epoxy resin | a | 4.1 | 2.5 | — | — | — | — |
| | b | 4.1 | 2.5 | 6.3 | 4.3 | 3.8 | 2.9 |
| | c | — | — | 6.3 | 4.3 | 3.8 | 2.9 |
| Phenol resin | a | 5.1 | 3.3 | — | — | — | — |
| | b | — | — | 8.2 | 5.2 | 6.5 | 3.2 |
| Acryl resin | a | 14.9 | 12.4 | — | — | — | — |
| | b | — | — | 17.4 | 14.4 | 28.0 | 7.5 |
| Curing accelerating agent | a | 0.3 | 0.3 | 0.3 | — | 0.3 | 0.3 |
| | b | — | — | — | 0.3 | — | — |
| Silica powder | | 71.5 | 79.0 | 61.5 | 70.8 | 55.6 | 83.2 |
| Viscosity (Pa · s) at 80° C. | | $5.0 \times 10^5$ | $4.5 \times 10^6$ | $1.9 \times 10^5$ | $5.5 \times 10^5$ | $9.4 \times 10^4$ | $7.8 \times 10^6$ |
| Viscosity (Pa · s) at 120° C. | | $2.1 \times 10^5$ | $1.5 \times 10^6$ | $6.8 \times 10^4$ | $2.7 \times 10^5$ | $3.0 \times 10^4$ | $4.2 \times 10^6$ |
| Intrusion of resin into below chip | | ○ | ○ | ○ | ○ | × | ○ |
| Evaluation of adhesion to substrate | | ○ | ○ | ○ | ○ | ○ | × |
| Storage stability at ordinary temperatures (Pa · s) | | $5.1 \times 10^5$ | $4.8 \times 10^6$ | $2.0 \times 10^5$ | Unmeasurable* | $9.4 \times 10^5$ | $8.0 \times 10^6$ |
| Reflow resistance test | | ○ | ○ | ○ | ○ | × | ○ |

*The viscosity was unmeasurable due to curing.

As can be understood from the results shown in Table 1, the thermosetting adhesive sheets of Examples 1 to 4 each having viscosities falling within the specific viscosity range at the temperatures in the specific temperature range were free from the intrusion of the resin into below the chip and the delamination with satisfactory adhesion to the substrate, and excellent in reflow resistance. In addition, Examples 1 to 3 were also excellent in ordinary temperature storage stability. The thermosetting adhesive sheet of Example 4, like those of the other examples, having viscosities falling within the specific viscosity range at the temperatures in the specific temperature sheet covers the chip device while keeping a hollow portion defined between the substrate and the chip device, the thermosetting encapsulation adhesive sheet comprising an epoxy resin composition, the epoxy resin composition comprising the following components (A) to (E):

(A) an epoxy resin comprising a naphthalenediol epoxy resin and a bisphenol-A epoxy resin in combination or an epoxy resin comprising a bisphenol-A epoxy resin and a trishydroxyphenylmethane epoxy resin in combination;

(B) a phenol resin;
(C) an acryl resin;
(D) silica powder; and
(E) a quaternary phosphonium salt compound,
wherein the acryl resin (C) is present in the epoxy resin composition in a proportion of 15 to 70% by weight based on the total weight of the organic components of the epoxy resin composition,
wherein the silica powder (D) is present in the epoxy resin composition in a proportion to 60 to 80% by weight based on the weight of the epoxy resin composition,
wherein the quaternary phosphonium salt compound (E) is present in the epoxy resin composition in a proportion of 0.1 to 10% by weight based on the weight of the epoxy resin composition, and
wherein the epoxy resin composition has a viscosity of from $5\times10^4$ to $5\times10^6$ Pa·s as measured at a temperature of 80° C. to 120° C. before thermosetting thereof.

2. A semiconductor device with an encapsulation resin layer, the encapsulation resin layer being formed such that the encapsulation resin layer covers a chip device mounted on a substrate through a connection electrode formed on the chip device, while keeping a hollow portion defined between the substrate and the chip device, the encapsulation resin layer being composed of a thermosetting encapsulation adhesive sheet comprising an epoxy resin composition, the epoxy resin composition comprising the following components (A) to (E):

(A) an epoxy resin comprising a naphthalenediol epoxy resin and a bisphenol-A epoxy resin in combination or an epoxy resin comprising a bisphenol-A epoxy resin and a trishydroxyphenylmethane epoxy resin in combination;
(B) a phenol resin;
(C) an acryl resin;
(D) silica powder; and
(E) a quaternary phosphonium salt compound,
wherein the acryl resin (C) is present in the epoxy resin composition in a proportion of 15 to 70% by weight based on the total weight of the organic components of the epoxy resin composition,
wherein the silica powder (D) is present in the epoxy resin composition in a proportion to 60 to 80% by weight based on the weight of the epoxy resin composition,
wherein the quaternary phosphonium salt compound (E) is present in the epoxy resin composition in a proportion of 0.1 to 10% by weight based on the weight of the epoxy resin composition, and
wherein the epoxy resin composition has a viscosity of from $5\times10^4$ to $5\times10^6$ Pa·s as measured at a temperature of 80° C. to 120° C. before thermosetting thereof.

* * * * *